(12) United States Patent
Amiotti et al.

(10) Patent No.: US 7,560,820 B2
(45) Date of Patent: Jul. 14, 2009

(54) INTEGRATED GETTER FOR VACUUM OR INERT GAS PACKAGED LEDS

(75) Inventors: Marco Amiotti, Milan (IT); Ronald O. Petersen, Pine, AZ (US)

(73) Assignee: SAES Getters S.p.A., Lainate (Milan) (IT)

( * ) Notice: Subject to any disclaimer, the term of this patent is extended or adjusted under 35 U.S.C. 154(b) by 233 days.

(21) Appl. No.: 11/104,958

(22) Filed: Apr. 12, 2005

(65) Prior Publication Data

US 2005/0230691 A1 Oct. 20, 2005

Related U.S. Application Data

(60) Provisional application No. 60/562,899, filed on Apr. 15, 2004.

(51) Int. Cl.
*H01L 23/29* (2006.01)
(52) U.S. Cl. .............. 257/788; 257/E33.061; 257/E21.499; 438/51; 438/58
(58) Field of Classification Search ......... 257/788, 257/E33.061, E21.499; 438/51, 58

See application file for complete search history.

(56) References Cited

U.S. PATENT DOCUMENTS

| | | | | |
|---|---|---|---|---|
| 5,513,198 A | * | 4/1996 | Jakobson | 372/43.01 |
| 5,629,952 A | * | 5/1997 | Bartholomew et al. | 372/33 |
| 5,696,785 A | | 12/1997 | Bartholomew et al. | |
| 5,770,473 A | * | 6/1998 | Hall et al. | 438/26 |
| 5,866,978 A | * | 2/1999 | Jones et al. | 313/495 |
| 6,139,390 A | * | 10/2000 | Pothoven et al. | 445/41 |
| 6,200,494 B1 | * | 3/2001 | Manini et al. | 252/181.7 |
| 6,304,367 B1 | * | 10/2001 | Battilana et al. | 359/333 |
| 2003/0071568 A1 | * | 4/2003 | Lowery et al. | 313/512 |
| 2004/0127358 A1 | * | 7/2004 | DeRosa et al. | 502/406 |

OTHER PUBLICATIONS

PCT/US2005/012577, filed Feb. 11, 2006, Search Report.
PCT International Search Report, dated Nov. 2, 2006.

* cited by examiner

*Primary Examiner*—Asok K Sarkar
(74) *Attorney, Agent, or Firm*—TIPS Group (57) ABSTRACT

A technique for controlling an atmosphere within an enclosure involves providing a getter within the atmosphere of the enclosure. An LED manufactured according to the technique may include a getter within an enclosed volume of the LED device.

151 Claims, 9 Drawing Sheets

INTEGRATED GETTER FOR VACUUM OR INERT GAS PACKAGED LEDS

CROSS-REFERENCE TO RELATED APPLICATIONS

This Patent Application claims the benefit of Provisional Patent Application No. 60/562,899 filed Apr. 15, 2004, which is incorporated herein by reference.

BACKGROUND

Light emitting diodes (LEDs) are solid-state light sources that work on the principle of the recombination of electrons and holes at the junction between a p-semiconductor and an n-semiconductor. The light emissions from LEDs are controlled by using different layers of luminescent materials deposited on the LED chip (substrate). The emissions of each layer are generally monochromatic. Different colors are achieved through the use of multilayers of luminescent materials and dyes. For example, multilayers of luminescent materials in the InGaAlP family grown onto suitable substrates can emit red, yellow or orange light. Multilayers of luminescent materials in the InAlGaN family grown onto SiC and $Al_2O_3$ substrates can emit blue, green or UV light.

To yield white light, output of three LEDs, e.g. a red, a green and a blue LED, can be combined. Alternatively, a single blue or UV LED can be used to excite a phosphor material that is placed in close proximity to the blue or UV LED. The phosphor material absorbs the blue or UV light and re-emits the light in a spectrum of including longer wavelengths. Thus, a phosphor coated blue LED can emit a spectrum of appropriate colors, which combine to produce white light.

White LEDs are produced by growing different layers of materials in the InAlGaN family using different doping substances to obtain the p-layers and n-layers. Organometallic vapor-phase epitaxy (OMVPE) is a common technique for growing such layers. In the OMVPE technique, organometallic molecules that contain the desired metallic atoms are transported in the gas/vapor phase onto a suitable substrate to yield a film on the substrate.

Examples of suitable substrates are Gallium Nitride (GaN), Aluminum Nitride (AlN), Aluminum oxide ($Al_2O_3$) and Silicon Carbide (SiC). The aluminum oxide and the silicon carbide may have a GaN or a AlN buffer layer between the substrate and the layers of light emitting diode structure. For example, the wafer substrate is covered completely with the layers of the light emitting diode structure which is then cut to create 10,000 LED dies per wafer. Each die is then mounted between two electrodes, to become the active element of the LED.

Phosphor material in the form of particles or thin film is deposited over the InAlGaN multilayer in order to shift the primary emission wavelength of the light emitting LED to the desired visible color emission spectrum. The phosphors comprise a host material such as YAG, CdS, ZnS, etc., that incorporate small concentrations of activator ions such as rare earth metals and transition metals. A description of phosphors is found in U.S. Pat. No. 6,466,135B1, which is incorporated herein by reference in its entirety. The InAlGaN multilayer LED with phosphors is typically encapsulated in a polymeric resin such as an epoxy resin. The encapsulation of LEDs in polymeric resins is described in U.S. Pat. No. 5,959,316, which is incorporated herein by reference in its entirety.

To increase the forward light emission of the LED, the phosphor covered multilayer LED can be placed in a suitable reflector cup. The reflector cup reflects the light emission towards the end of the LED.

The heat and UV energy from the LED can cause the polymeric resin encapsulation to degrade. The degradation of the polymeric resin encapsulation, in turn, causes a yellowing appearance of the light emission. Further, the emission efficiency of both the phosphor layer and the InAlGaN multilayer structure degrades in the presence of moisture. The oxidation state of the phosphor activator can change in the presence of oxygen, thus causing a reduction in light emission and a possible shift in emission wavelength. Since high power LEDs (e.g. white light LEDs) operate at significantly elevated temperatures, this oxidation reaction is temperature-enhanced. The change of color and intensity of the emission of LEDs is typically undesirable and especially so with white light LEDs.

Figure 1:
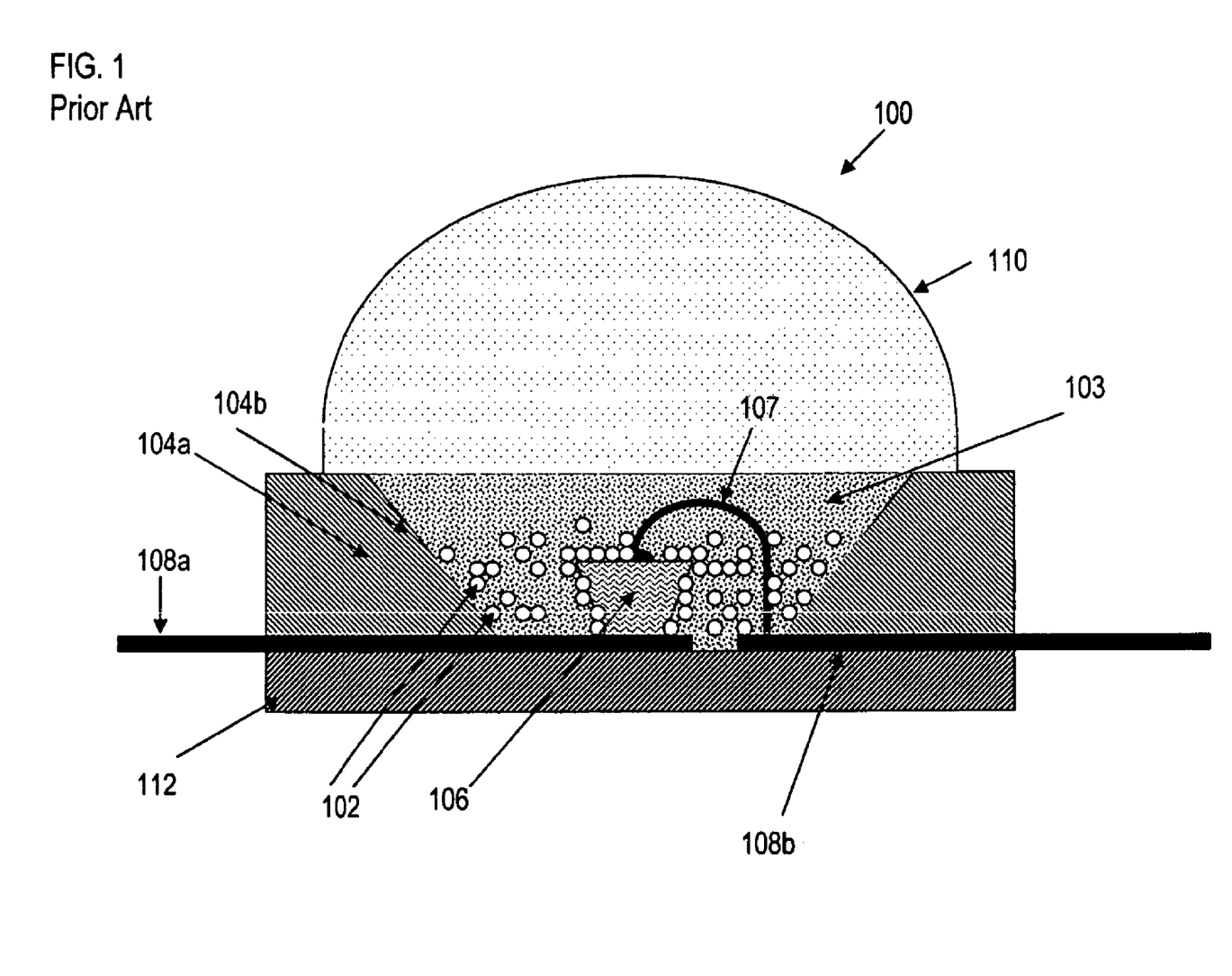
FIG. 1 is a cross-sectional view of a prior art LED assembly.

FIG. 1 is a cross-sectional view of a prior art LED assembly 100 which includes a base or base 112. Of course, this assembly is just exemplary of a variety of types of LED assemblies. A paper describing several types of LED assemblies is "Packaging Challenges of High-Power LEDs for Solid State Lighting", by Shatil Haque et al, Lumileds Lighting, San Jose, Calif., incorporated herein by reference.

In FIG. 1, an LED semiconductor material 106 is secured to a lead 108a. This can be accomplished using a silver-loaded conductive epoxy which provides high reflectivity. Alternatively, for "flip-chip" type LED structures solder-bump bonding can be advantageously used, as they do not hinder the extraction of light radiating from the active region.

Secured to the base 112 is a reflector cup 104a and leads 108a and 108b. Reflector cup 104a can be a solid mass of material having, for example, an inverted, truncated conical aperture providing a reflective surface 104b. The reflector cup 104a can be made from an electrically insulating material such as glass, ceramic or plastic. The reflective surface 104b can, for example, be a thin film of aluminum applied, for example, by a sputtering process. The leads 108a and 108b are typically made from a copper alloy. A bonding wire 107 electrically couples lead 108b to the top of LED material 106. A polymeric resin 103 is disposed within the conical aperture of the reflector cup 104a and encapsulates the LED material 106 and bonding wire 107. The encapsulant 103 preferably has interspersed, within it, phosphor materials 102 (shown as small bubbles) for shifting the emission wavelengths of the LED material to, for example, produce a "white" light. By "white", it is meant herein that a broad spectrum of visible light is produced which produces a light which appears substantially white, although it may be somewhat tinged with certain frequencies (e.g. blue). A solid polymeric resin encapsulation dome 110 is bonded to the reflector cup 104a and over the encapsulant 103 such as by being epoxied or glued.

LED material 106 may include an InAlGaN multilayer LED structure. Base 112 may be made of an insulating material such as sapphire ($Al_2O_3$) or silicon carbide, for example. The base 112 should be very poor electrical conductor (e.g. an insulator), but is preferably a reasonably good thermal conductor. A heat sink (not shown) can be optionally attached to or form part of the base 112 to help dissipate heat from the LED assembly 100. Leads 108a and 108b are electrode leads and can be made of electrical conducting material, including copper and copper alloys. Leads 108a and 108b may be about the same width as the base of LED material 106. Reflector cup 104a may be made of an insulating material such as glass or ceramic, for example.

Figure 2:
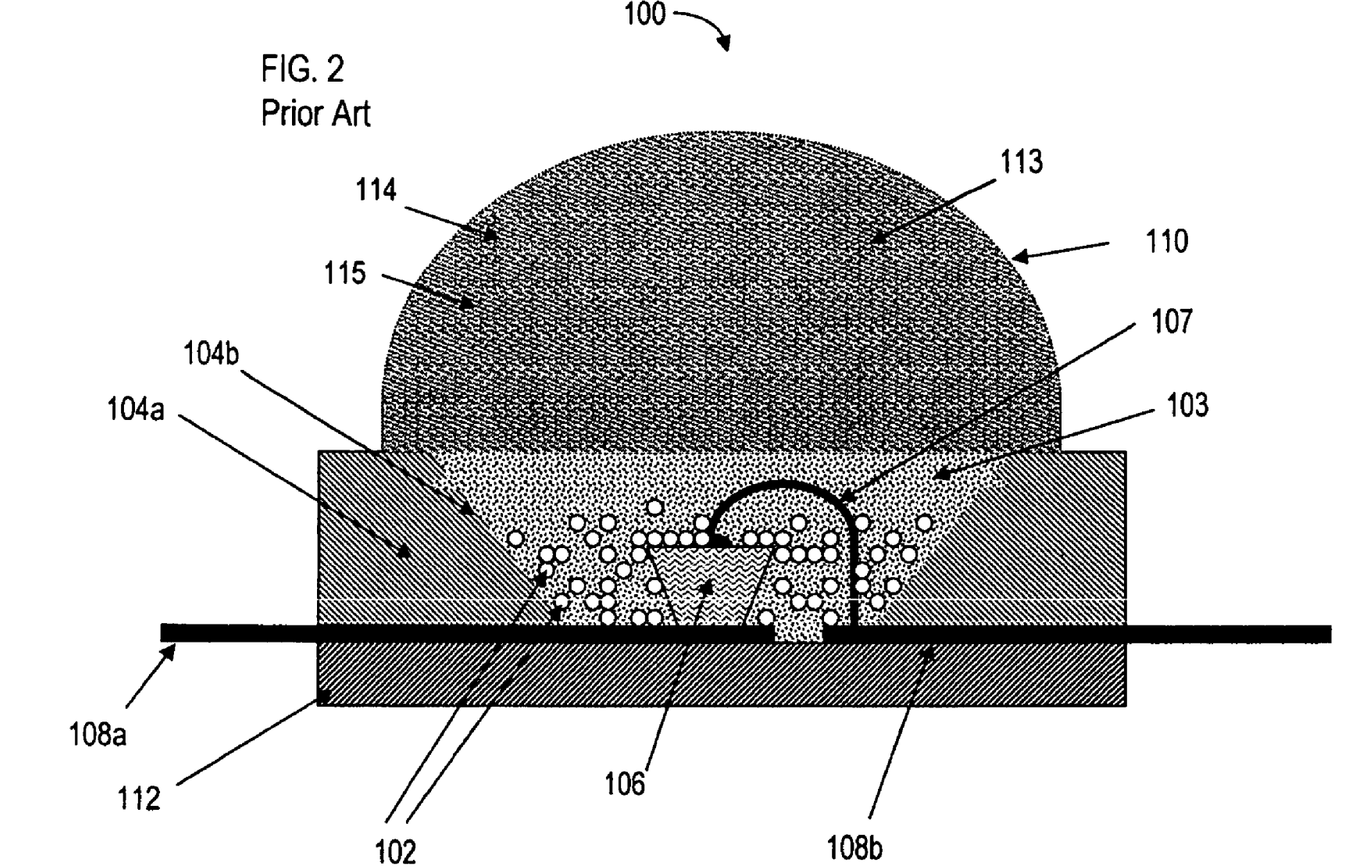
FIG. 2 is the cross-sectional view of a prior art LED assembly after a period of usage to illustrate degradation problems.

FIG. 2 illustrates certain problems encountered in the prior art LED assembly after a period of usage. After a period of time of operation of the LED 100, the ultraviolet (UV) light and heat energy generated by LED material 106 will cause the polymeric resin encapsulation dome 110 to discolor or "yellow." This is illustrated by the discoloration 113 of the dome 110. The yellowing of the polymeric resin encapsulation dome 110, in turn, causes an absorption of light emitted from the InAlGaN multilayer structure and phosphor materials, particularly in the blue portion of the visible spectrum. This causes a reduction in light output from the LED, and a shift in the output color. Therefore, output of the LED 100 becomes less bright and less white (e.g. more yellow).

Further, both the phosphor materials and the InAlGaN multilayer structure react with moisture 115 (e.g. water vapor) that may diffuse through the solid polymeric dome and cause a degradation of the light emission intensity of the LED. Further, the moisture in assembly 100 can cause corrosion of the electrodes and other parts in assembly 100. The phosphor materials can also react with the oxygen 114 that may diffuse through the solid polymeric dome and cause a shift in the wavelength of the light emission. Thus, the effects of moisture and oxygen in the LED assembly are deleterious to the performance of the LED.

Based on the foregoing, there is a need for producing LED assemblies that maintain a high intensity and stable wavelength in the LED light emissions during operation, and which do not quickly degrade with use due to exposure to oxygen, moisture and/or other contaminants.

SUMMARY

A method for controlling an atmosphere within an LED enclosure according to a non-limiting embodiment includes providing a getter within an atmosphere of the LED enclosure and activating the getter, whereby contaminants can be removed from the atmosphere.

In an embodiment, an LED assembly includes a reflector cup coated with a getter material, a dome for covering the reflector cup and the LED; and a non-reactive atmosphere contained within the dome. Another embodiment includes a base, a light emitting semiconductor attached to the base, a translucent cover sealed to the base over the light emitting semiconductor and defining an internal chamber; and a controlled atmosphere having less than about 100 PPM of oxygen or water within the chamber. In a non-limiting embodiment, the LED assembly also includes a getter in contact with the controlled atmosphere, where the controlled atmosphere is at a pressure between, by way of example but not limitation, 10 atmospheres and $10^{-3}$ torr. Alternatively, the controlled atmosphere is a vacuum at less than $10^{-3}$ torr. Further alternatively, the controlled atmosphere includes a non-reactive gas selected from the group including inert gasses and noble gasses. Still further alternatively, the controlled atmosphere is a fluid which is non-reactive with materials having surfaces exposed to the chamber.

Advantageously, according to certain embodiments, the deleterious effects of moisture and oxygen on the active layer can be minimized by maintaining the assembly of the LED in a controlled atmosphere such as in a vacuum, a non-reactive gas, or a liquid. Further, moisture and oxygen can be removed from the vacuum or inert gas by using getters. The embodiments are suitable for various types of LEDs including blue LEDs, green LEDs, UV LEDs, and white light LEDs.

These and other advantages of the present invention will become apparent to those skilled in the art upon a reading of the following descriptions and a study of the several figures of the drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

FIGS. 1 and 2 were discussed with reference to the prior art. FIGS. 3-8D will be discussed with reference to a controlled internal atmosphere LED illustrated by various exemplary embodiments of the present invention.

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in schematic form in order to avoid unnecessarily obscuring the present invention.

By "controlled atmosphere", it is meant that the atmosphere in contact with the active semiconductor portion of the LED (the InAlGaN multilayer, for example) is controlled to reduce the deleterious effects of certain contaminants which may interact with the phosphor materials and the InAlGaN multilayer structure. The "controlled atmosphere" can range from a vacuum to low pressure to above atmospheric pressure range and, if not a vacuum, can include noble, inert or "benign" fluids. The "controlled atmosphere" includes a fluid that may be gaseous, although it can include a liquid in certain embodiments. For instance, the controlled atmosphere may include, by way of example but not limitation, mineral oil.

A "getter" is a scavenger material that has an affinity for certain substances, such as hydrogen or oxygen. A getter that has an affinity for water may be referred to as a drier. A getter may be a composite material comprising a getter material effective to sorb gasses and a drier effective to sorb moisture.

The material of the getter can be a metal, metal compound (e.g., reduced metal oxide), non-metallic compounds, zeolites, certain plastics etc., that are effective to sorb contaminants from the controlled atmosphere.

By "contaminants" it is meant any substance which can degrade the performance of the LED assembly. For example, in the context of white LEDs, contaminants may include oxygen and water. However, getters used in the embodiments herein may be effective to remove other contaminants if necessary, and may vary from implementation to implementation.

According to certain embodiments, suitable getters include metal getters such as getter alloys containing zirconium, vanadium, iron, manganese and one or more elements selected among yttrium, lanthanum and Rare Earth metals. Such alloys are described in U.S. Pat. No. 6,521,014, which is incorporated herein by reference in its entirety. Titanium getters and halfnium getters may also be suitable. Other suitable getters include oxides selected among category 2A in the periodic table. Some examples of category 2A oxides are calcium oxide, manganese oxide, etc. The embodiments are not restricted to any one type or combination of getters. Any appropriate getter that is capable of removing or "scavenging" moisture, oxygen and other contaminants may be used. While the primary mechanisms for removing contaminants with getters include absorption (e.g. a chemical reaction of the contaminant with the getter) and adsorption (e.g. a contaminant sticking to a surface of the getter), which are collectively referred to as "sorb", "sorbing" and "sorption", etc., other mechanisms such as entrapment of contaminants within a matrix of a zeolite are also contemplated in alternative embodiments, depending upon the needs of a given embodiment.

According to certain embodiments, the getters are introduced into an LED assembly by techniques such as sputtering and evaporation, which are well known in the art. Another technique for introducing getters into an LED assembly is by electrophoresis. Getter can also be mechanically attached, chemically bonded, etc. into the LED assembly. The embodiments are not restricted to any one method of introducing suitable getters into LED assemblies. Thus, the introduction of suitable getters into LED assemblies may vary from implementation to implementation.

Figure 3:
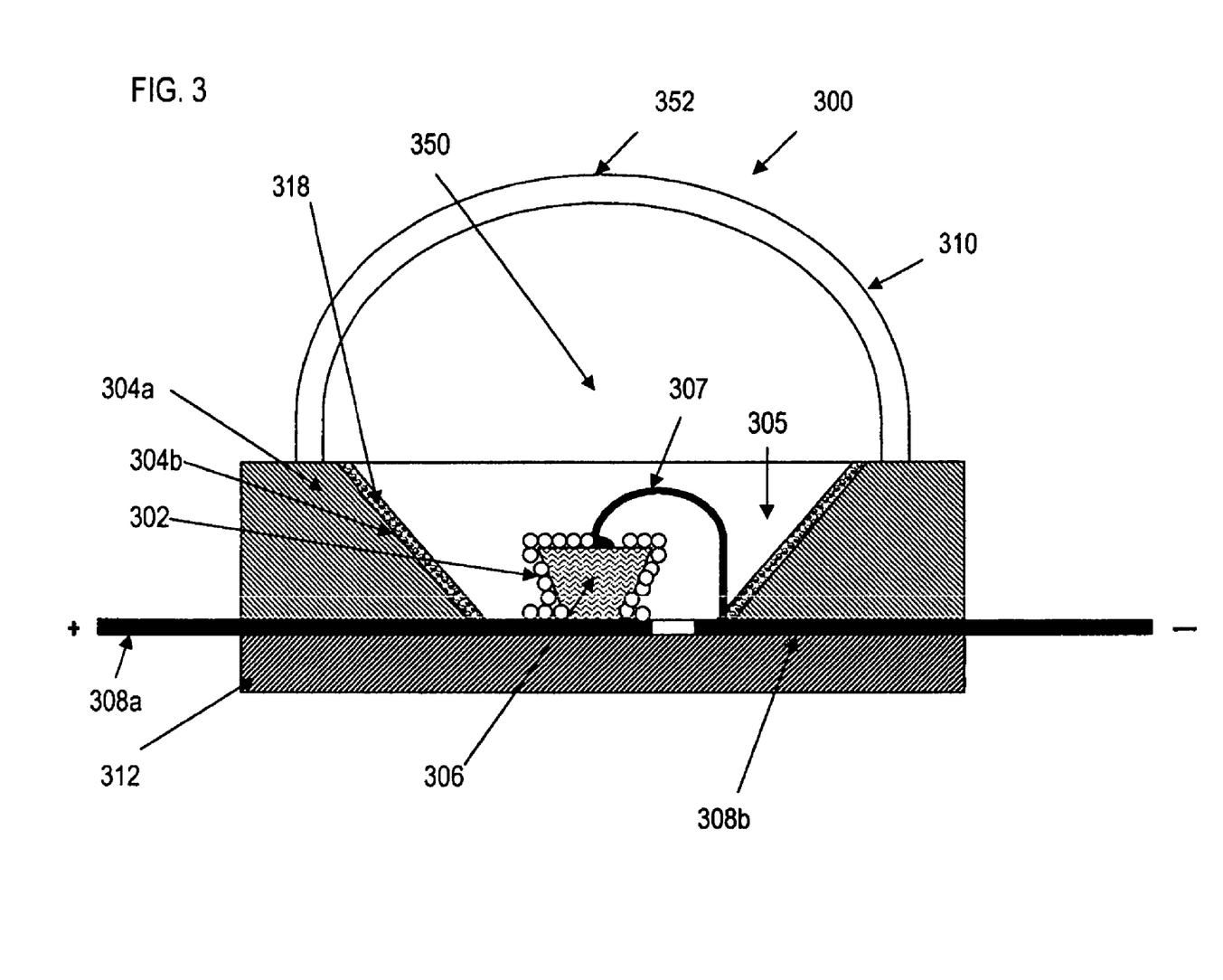
FIG. 3 is a cross-sectional view of an LED assembly, according to certain embodiments of the invention.

FIG. 3 is a cross-sectional view of an LED assembly 300, according to certain embodiments of the invention. LED assembly 300 comprises a base 312. LED material 306 is secured to a lead 308a. Secured to the base is a reflector cup 304a and leads 308a and 308b. Reflector cup 304a preferably has an inverted, truncated conical aperture 305 and is provided with a reflective surface 304b. A bonding wire 307 couples lead 308b to the top of the LED material 306 by, for example, a solder bonding technique. A layer or thin film of phosphor materials 302 is deposited on LED material 306. A dome 310 is sealed (e.g. by epoxy, glue, indium metal or fusion bonding) onto the reflector cup 304a to fully enclose the reflecting surface 304b and the LED material 306.

The operation of LED assemblies, such as LED assembly 300, is well known to those skilled in the art. The LED material 306 is a semiconductor material that acts as a diode allowing current to substantially flow in one direction only, e.g. from an anode or positive electrode to a cathode or negative electrode. The cathode and anode are typically on opposing sides of the LED material 306. In this example, the contact between the lead 308a and the bottom of LED material 306 comprises an anode connection, and the contact between the bonding wire 307 and the top of the LED material 306 comprises a cathode connection. Of course, these connections can be reversed in alternate embodiments. The connection of the bonding wire 307 to the top of the LED material 306 is typically done in such a fashion as to balance the desire for a broad cathode contact with the desire not to block emissions from the top of the LED material 306.

The reflective surface 304b causes certain emissions from the LED material 306 and phosphors 302 to be directed out of the top portion 352 of the LED assembly. The reflective surface 304b has a thin film of getter 318 that has preferably been sputtered or evaporatively deposited onto the reflective surface.

Dome 310 may be made of any suitable non-permeable material that is preferably resistant to degradation due to the UV and heat energy from the LED. Examples of suitable materials for dome 310 include glass and quartz (pure $SiO_2$). The glass can be a variety of suitable types. However, glass that can absorb UV light is preferred when there is a chance for significant human exposure since UV light can have deleterious effects on the retina of an eye and on human tissue, in general. For applications where UV light is beneficial (e.g., for biological purification), a glass that does not absorb UV light is preferred. The glass can be a substantially pure form of $SiO_2$ doped with other elements or compounds, or other formulations well known to those skilled in the art. The dome may be convex (e.g., hollow), as depicted in FIG. 3, but may be solid in alternative embodiments.

According to some embodiments, a vacuum is maintained in chamber 350. According to other embodiments, chamber 350 may contain a noble gas, such as argon, or an inert gas such as nitrogen that does not react with the getter material. As used herein, a "noble" gas consists of the gasses found in Group 18 of the periodic table, such as helium, neon, argon, krypton, etc. Noble gasses are typically non-reactive with other elements or compounds. By "inert" gas it is meant herein that gas is generally non-reactive. Nitrogen is an example of an inert gas by this definition. By "non-reactive" fluid, it is meant a gas or liquid that is generally non-reactive with the materials in which it is in contact, such as the materials having surfaces exposed to the chamber of the LED assembly.

Certain getter materials require activation before they can become effective in absorbing contaminants such as moisture, oxygen, etc. Other getter materials do not require activation. Exemplary activation processes for those types of getters requiring activation are described in greater detail subsequently with reference to FIGS. 7 and 8D.

Figure 4:
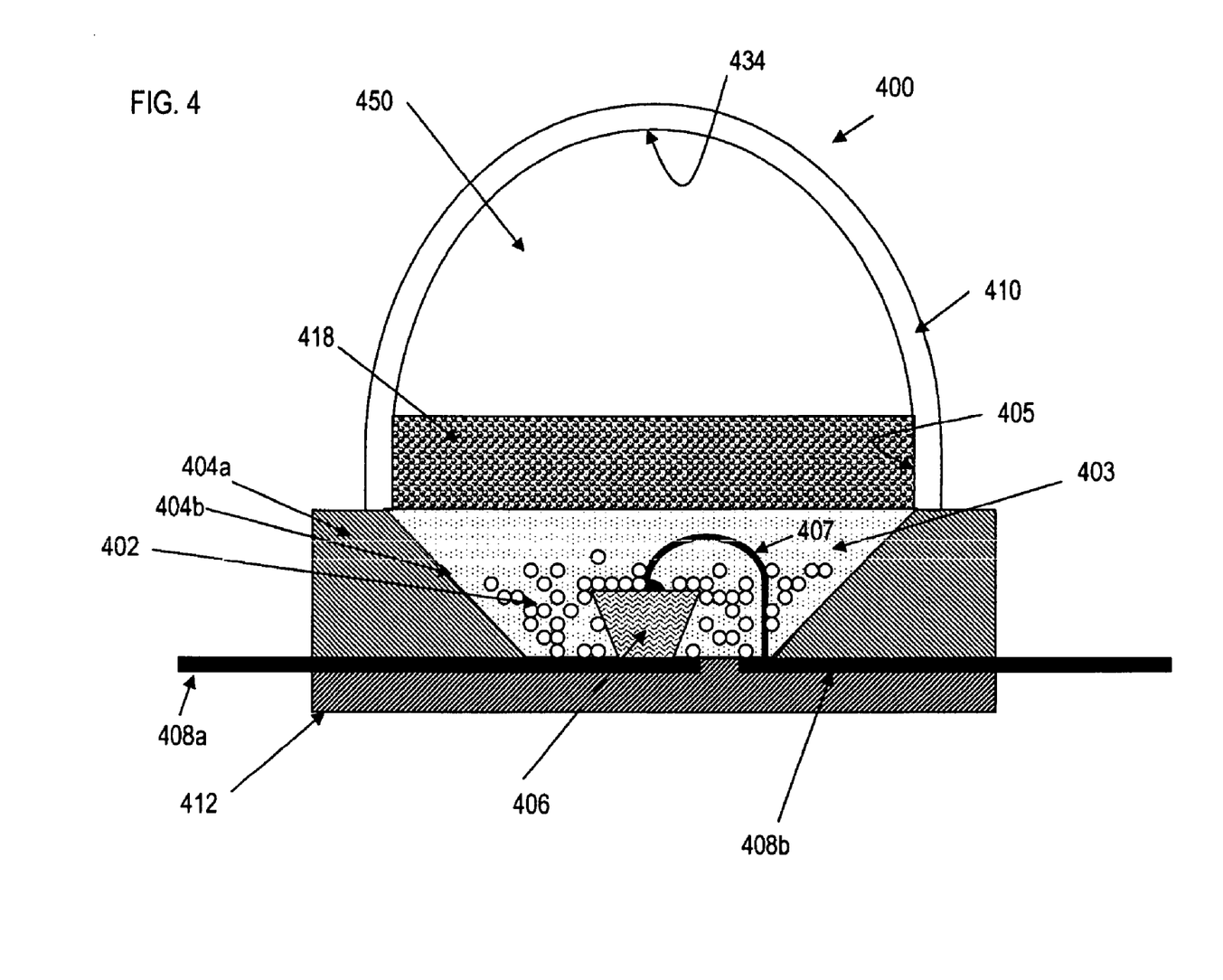
FIG. 4 is a cross-sectional view of an LED assembly with getter deposited on the encapsulation dome, according to certain embodiments of the invention.

FIG. 4 is a cross-sectional view of an LED assembly with getter materials deposited on interior surfaces a dome 410, according to certain embodiments of the invention. In FIG. 4, LED assembly 400 comprises a base 412. LED material 406 is secured to the base 412 by a lead 408a. By "secured to the base 412 by a lead 408a", it is meant herein that the LED material 406 is secured to the lead 408a by a suitable attachment method, and that lead 408a is secured to the base 412 by a suitable attachment method. That is, the lead 408a is partially sandwiched between the LED material 406 and the base 412.

In the example of FIG. 4, a reflector cup 404a and a lead 408b are also secured to the base 412. A bonding wire 407 electrically couples the lead 408b to the LED material 406. The reflector cup 404a has an aperture having sidewalls provided with a reflective surface 404b. Of course, other reflector configurations and structures may be used in other embodiments.

In the example of FIG. 4, the LED material 406 is encapsulated in an encapsulant such as a polymeric resin 403. The encapsulant 403 preferably has interspersed, within it, phosphor materials 402 effective to shift a primary emission wavelength. The phosphor materials 402 may or may not be concentrated near the LED material 406, and in some other embodiments the materials are more evenly dispersed or dispersed with other concentration profiles. According to certain other embodiments, a layer or thin film of phosphor materials may be deposited on LED material 406. The dome 410 may be attached, e.g. by epoxy, glue, indium metal or fusion bonding, to the reflector cup 404a to cover the reflector cup's reflecting surface 404b and the LED material 406. An inner surface 405 of the dome 410 substantially defines the chamber 450 within LED assembly 400. In the example of FIG. 4, the inner surface 405 of the dome 410 has getter material 418 deposited on it.

The reflective surface 404b causes certain emissions from the LED material 406 to be directed towards the top portion 434 of the LED assembly. The dome 410 may be made of any suitable material that is transparent to the wavelength(s) of interest. In order to allow light to pass through, the top portion 434 of dome 410 may be generally, substantially, or completely free of getter material.

According to some embodiments, a vacuum is maintained in chamber 450. According to other embodiments, chamber 450 may contain an inert or noble gas. According to other embodiments, chamber 450 may include a non-reactive fluid. The getter 418 may absorb contaminants such as moisture, oxygen, etc. Some getters may require activation, which may include chemically treating the getter, exposing the getter to heat or radiation, or activating the getter in some other manner.

Figure 5:
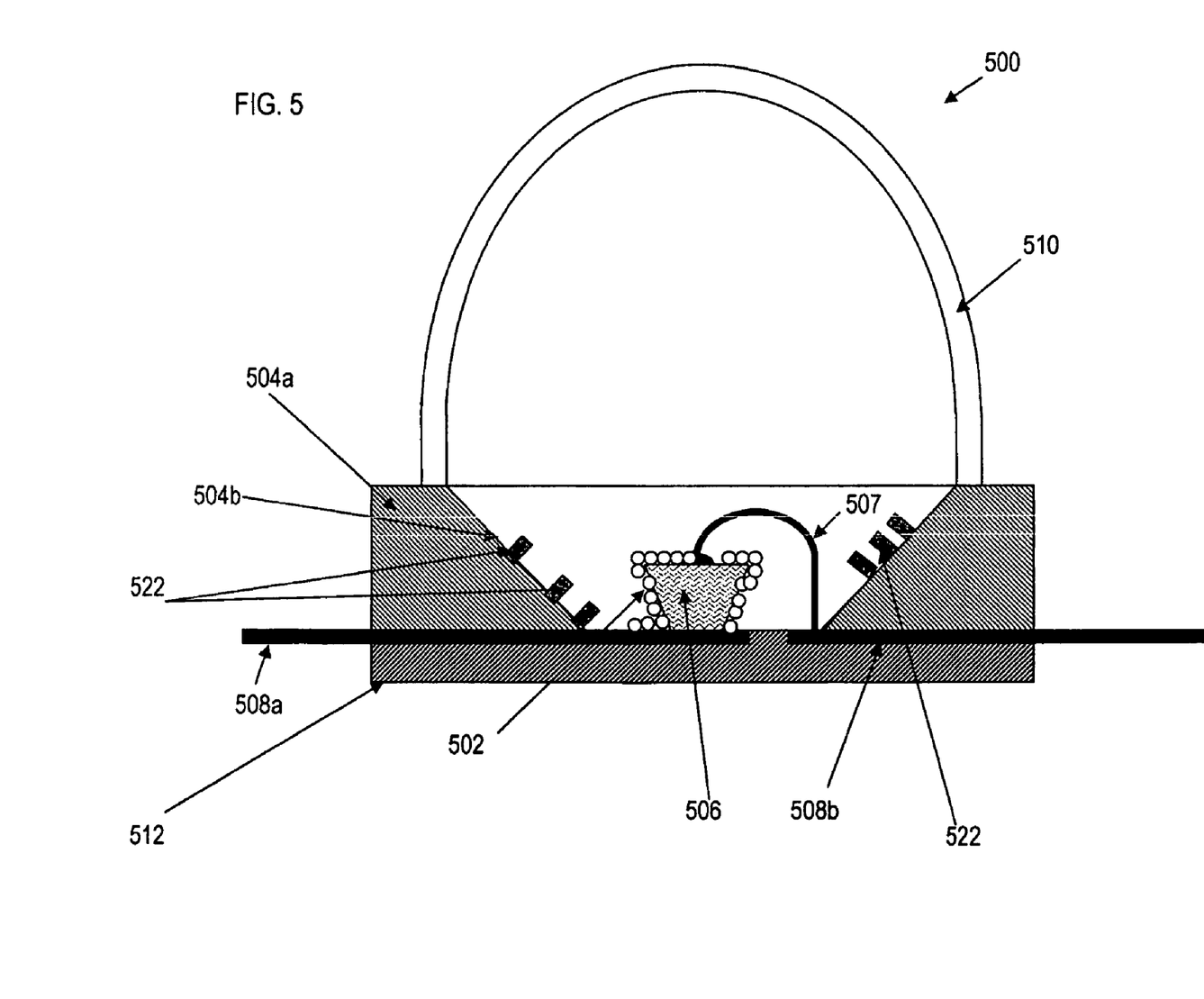
FIG. 5 is a cross-sectional view of an LED assembly containing getter materials in particulate form, according to certain embodiments of the invention.

FIG. 5 is a cross-sectional view of an LED assembly 500 containing getter materials in particulate form, according to certain embodiments of the invention. By "particulate" it is meant that discrete particles, masses, chunks or bodies of getter material are employed. These particles can be very fine, e.g. a fine powder having dimensions of about 100 microns up to relatively large chunks of material having dimensions as large as a few millimeters. Larger or smaller particles may be used in alternate embodiments. For example, an LED assembly that is several centimeters across may have some relatively large particles of getter with dimensions of one or more centimeters.

In the example of FIG. 5, LED assembly 500 comprises a base 512. LED material 506 is secured to the base 512 by a lead 508a. Also secured to the base 512 is a lead 508b and a reflector cup 504a including an aperture providing a reflective surface 504b. A layer of phosphor material 502 is preferably deposited on LED material 506.

In the example of FIG. 5, a dome 510 is sealed to the reflector cup 504a to fully encapsulate the reflector cup's reflecting surface 504b and the LED material 506. The dome 510 may be made of any suitable non-permeable material. It may be desirable to form the dome 510 of a material that does not degrade due to the UV and heat energy from the LED and is transparent to the wavelength(s) of interest. Such a material may include, by way of example but not limitation, glass or quartz.

The reflector cup's reflective surface 504b has adhered to it discrete particles of getter 522. Various techniques may be used to deposit the particles of getter material onto the reflector cup 504a. According to some embodiments, if the reflector cup has a metal film deposited on the walls of the aperture, the metal film can act as an electrode for purposes of performing attachment of the particles to the reflector cup by electrophoresis. Similarly, electrophoresis can be used to deposit the particles of getter onto the dome 510, after the deposit of a conductive film to serve as an electrode. Alternatively, particles can be glued, swaged, or otherwise adhered to the surface of the aperture walls of the reflector cup 504a.

Figure 6:
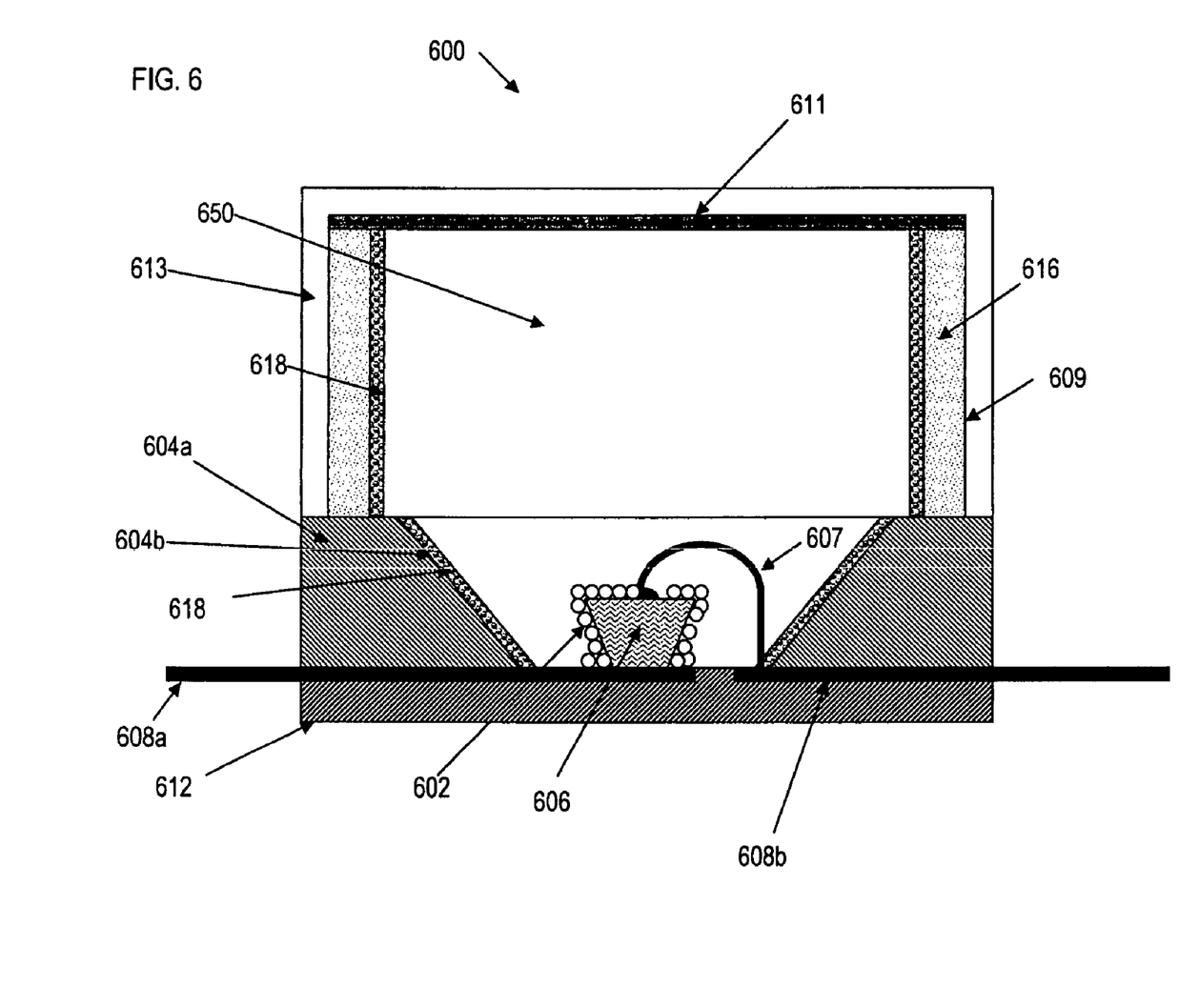
FIG. 6 is a cross-sectional view of another embodiment of an LED assembly comprising an encapsulation cover, which can include both plastic and glass elements.

FIG. 6 is a cross-sectional view of yet another embodiment of an LED assembly. In the example of FIG. 6, an LED assembly 600 comprises a base 612. LED material 606 is secured to the base 612 by a lead 608a. Also secured to the base is a reflector cup 604a and a lead 608b. A wire 607 attaches the lead 608b to the top of the LED material 606. Reflector cup 604a has an aperture provided with a reflective surface 604b. A layer of phosphor material 602 is deposited on LED material 606. A hollow cover 609 is attached to the reflector cup 604a to enclose the reflector cup's reflecting surface 604b and the LED material 606.

Hollow cover 609 may include a plastic, glass or quartz cylinder 616 capped with a suitable lens 611. The lens 611 may be made of glass, quartz or other suitable material. Suitable materials do not degrade due to the heat energy from the LED or are resistant to such degradation. Suitable materials may also be generally impermeable. A plastic shell 613 can be used to hold the assembly together.

The cylinder 616 may be impregnated with suitable getter for absorbing contaminants. Alternatively, the cylinder may just be, for example, a plastic or glass cylinder. If the cylinder 616 is plastic, it should be coated to make it substantially impermeable. This coating can conveniently be a getter film 618 provided on the interior surface of cylinder 616. Additionally, getter can be provided on the reflective surface 604b. However, it may be desirable not to have any getter or other obstruction on the lens 611 such that light can freely pass through. In an embodiment, the lens is made of an impermeable substance such as, by way of example but not limitation, glass or quartz. Alternatively, the lens could be made of, for example, plastic coated with a transparent sealing layer.

Figure 7:
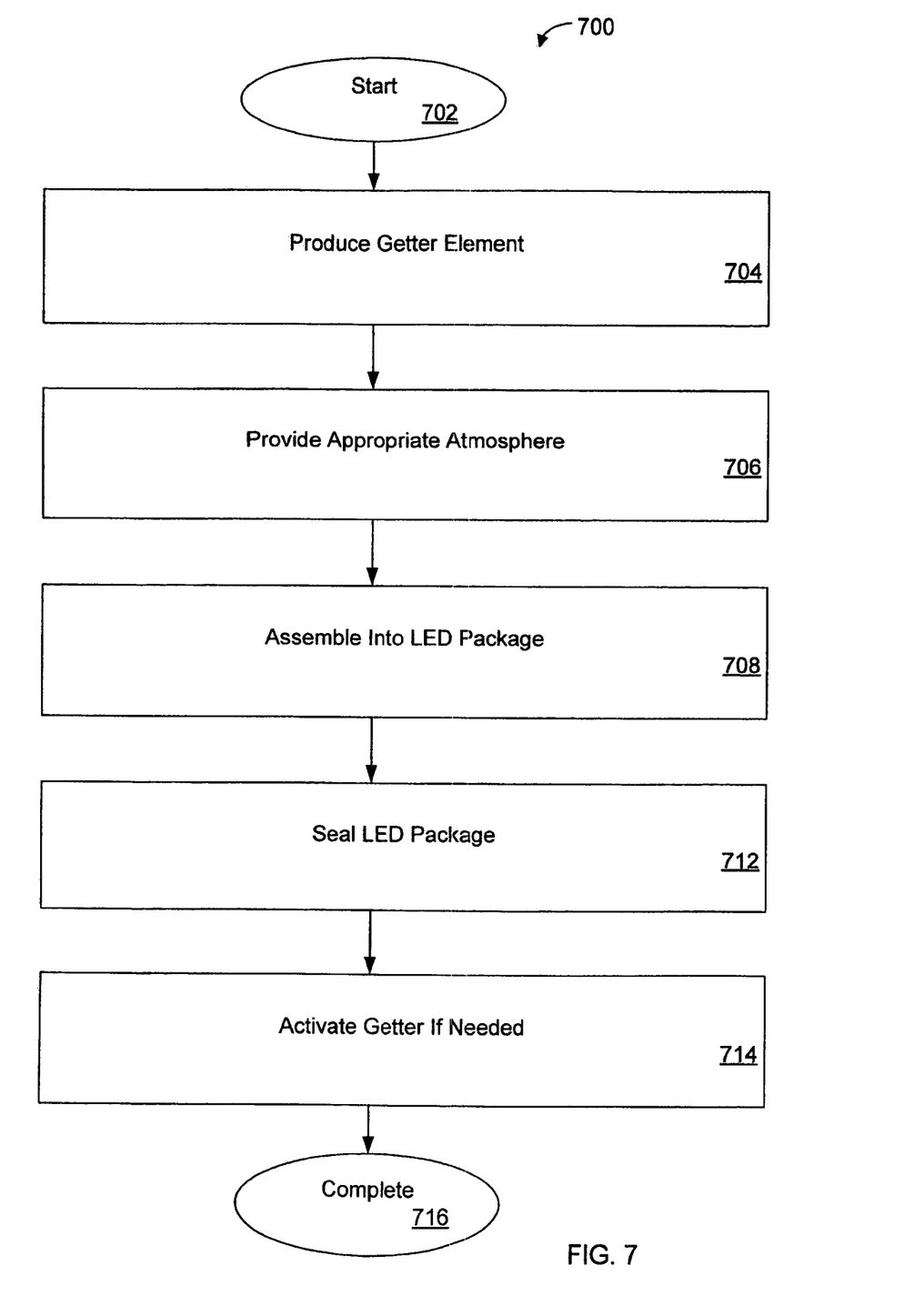
FIG. 7 is a flow diagram that illustrates a method for manufacturing an LED assembly, according to certain embodiments of the invention.

FIG. 7 is a flow diagram that illustrates some basic operations for manufacturing an LED assembly and may advantageously be considered in conjunction with FIGS. 8A through 8D. In FIG. 7, a manufacturing procedure 700 begins at 702 and proceeds to step 704 where the getter element is produced. The getter element refers, for example, to a reflector cup and/or a dome or hollow cover with deposited layers of getter materials, or any other getter element that is in fluid communication with the internal atmosphere of the LED assembly. In step 706 an appropriate atmosphere is provided for the internal chamber of the LED assembly. The appropriate atmosphere may be a vacuum, an inert gas, a noble gas, or any other suitable fluid.

At step 708, the LED is assembled into the LED package the presence of the appropriate atmosphere. Examples of gases appropriate for use in the atmosphere include nitrogen, argon, helium, and neon. By "vacuum", it is meant that the pressure is significantly below atmospheric pressure, e.g., less than about $10^{-3}$ torr and preferably less than about $10^{-5}$ torr. At step 712 the LED package is sealed using any suitable sealing method. At step 714, the getter is activated if the getter is such that it needs activation. The getter may be activated before/during/or after the LED package is sealed. For example, the getter may be activated by heating the getter to about 350° C. for about 10 to 30 minutes. During activation of the getter, the contaminants sorbed by the getter diffuse into the bulk of the getter or are expelled from the getter. After activation, the activated getter is ready to sorb contaminants. The procedure 700 is complete at 716.

Figure 8A:
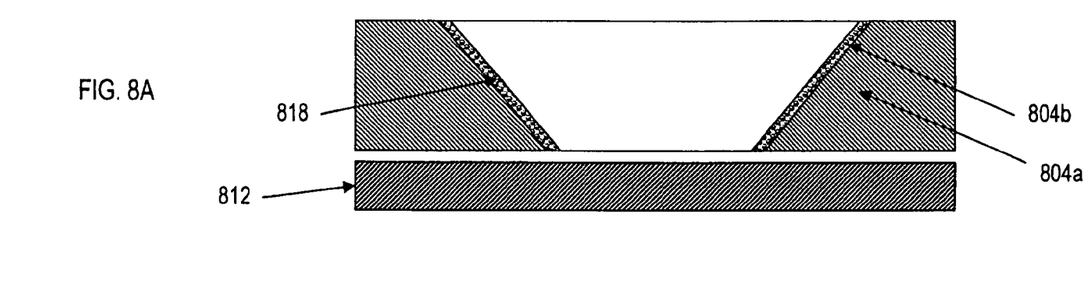
FIGS. 8A-8C are cross-sectional views of various components of LED assemblies according to certain embodiments of the invention.
Figure 8B:
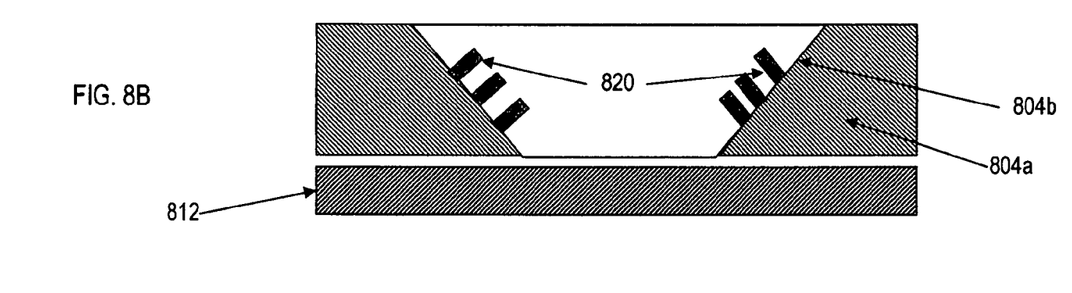
Figure 8C:
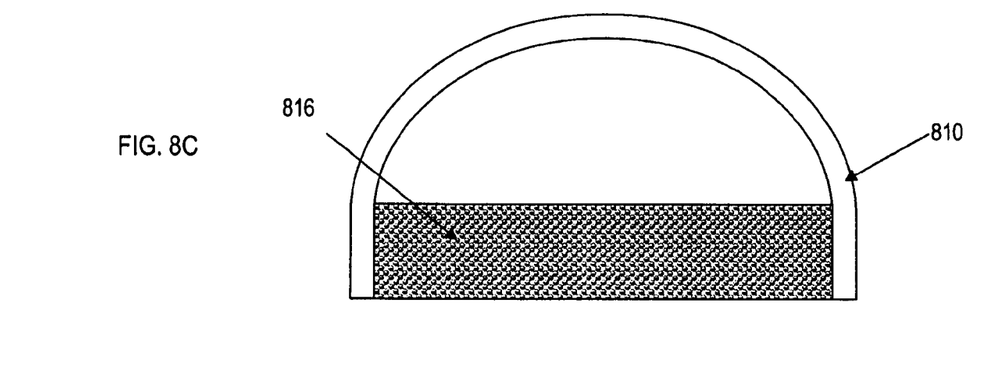

FIGS. 8A-8C are cross-sectional views of illustrating components of several embodiments of LED assemblies. They can also be used as examples with respect to the various steps set forth in FIG. 7. FIG. 8A shows a base 812 and reflector cup 804a with an aperture providing a reflective surface 804b.

Reflective surface 804b includes a thin film of getter material 818 that has been sputtered, evaporation deposited, etc. onto the walls of the aperture. FIG. 8B shows a base 812 and reflector cup 804a with reflective surface 804b. Adhered to reflective surface 804b are getter particles 820. In FIG. 8C, a dome 810 includes a film of getter 816 provided on an internal surface of dome 810.

Figure 8D:
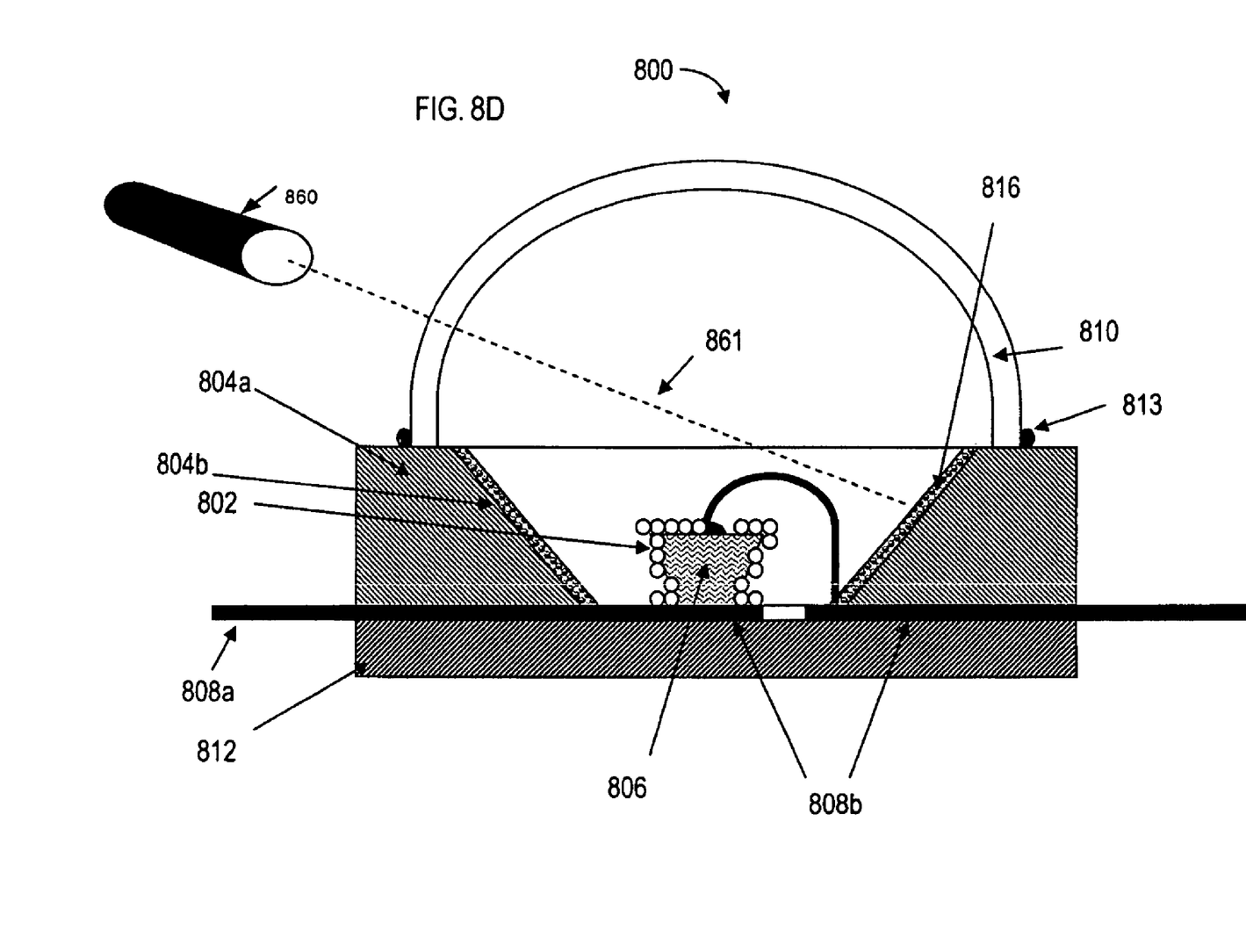
FIG. 8D is a cross-section of an LED assembly being activated in accordance with an embodiment of the present invention.

FIG. 8D illustrates a laser getter activating method of the present invention wherein a laser beam 860 may be used to activate the getter material. The laser beam 860 shines through the dome 810 as indicated at 861 and heats the getter material 804b. There may be some mechanism creating relative movement between the laser beam 860 and the getter material. For example, the laser can be moved, or the LED assembly 800 can be moved, or the laser beam 860 can be move by, for example, a mirror or prism assembly (not shown). Also shown is an additional sealing bead 813 to ensure a gas-tight seal between the dome 810 and the reflector cup 804a, especially during heating due to the activation process. Various other techniques are suitable to activate the getter material, as will be appreciated by those skilled in the art.

It should be noted that one or more getters can be used simultaneously to control the atmosphere within the LED assembly. For example, CaO can be used to absorb water, while a metal getter can be used to absorb oxygen. The getters can be placed at various locations as long as the getters do not interfere with the operation of the LED. For example, one getter can be provided on the reflector, and another getter on the dome.

According to certain embodiments, the LED assembly comprises a phosphor layer in close proximity to the InAlGaN multilayer structure. The LED is preferably a white LED or high brightness LED. However, the embodiments are not restricted to white LEDs or high brightness LEDs. The reflector cup cause certain emissions from the LED to be directed to the top portion of the LED assembly. The LED and the reflector cup are bonded to a base by a suitable bonding technique. The reflector cup and the multilayer light emitting diode structure die are completely covered by a glass dome that is preferably adapted for blocking UV light. The reflector cup may have a thin film of getter material that has preferably been sputtered or evaporated onto the reflector cup. For example, the getter material can be St 787™ getter material, which is commercially available from SAES Getters S.p.A. of Lainate (Milan) Italy. The internal atmosphere of the assembly is either a vacuum or a non-reactive fluid. The glass dome can be glued to a base or other support structure that is supporting the reflector cup and InAlGaN multilayer structure to seal the assembly.

According to certain other embodiments, the internal atmosphere of the LED assembly is pressurized to a pressure that is above atmospheric pressure. For example, the internal atmosphere of the LED assembly may be pressurized to about 1 to 100 times ambient atmosphere. The internal atmosphere is such an assembly may comprise non-reactive gases including nitrogen and noble gases. The pressurized embodiment may include getters on the reflector cup and/or the glass dome of the LED assembly. The glass dome advantageous in that it is a substantially impermeable material. In certain other pressurized embodiments, the getters may be omitted.

The above-described examples refer to an LED material. It should be noted that these examples are not intended to be the only possible embodiments. Nanotubes, optical receptors, and other devices could be used in place of the LED material in alternative embodiments.

The above-described examples refer to domes and lenses that cover an internal atmosphere of the device. It should be noted that the domes could be solid or hollow in alternative embodiments. In the case of a solid dome, the placement of the getter would probably not be within the solid dome (see, e.g., FIG. 4). In another alternative, the reflector cup could be solid, filled by way of example but not limitation with epoxy, and the getter material may be located within a hollow dome, as depicted in FIG. 4. In general, in alternative embodiments, any portion of the internal atmosphere could be replaced with a solid substance, such as by way of example but not limitation resin.

The above-described examples refer to internal atmospheres within a device. In alternative embodiments, the "atmospheres" may be by way of example a vacuum or a fluid. Depending upon the characteristics of the components within the atmosphere and the walls that define the interior volume of a device, various fluids or vacuum may be desirable that do not interfere with the function of components and are inert with respect to the materials. In another embodiment, the atmosphere may be an incompressible (or compression-resistant) fluid that increases the durability of the device by filling the internal volume.

In the foregoing specification, embodiments of the invention have been described with reference to numerous specific details that may vary from implementation to implementation. The specification and drawings are, accordingly, to be regarded in an illustrative rather than a restrictive sense.

What is claimed is:

1. A method comprising:
   providing a light-emitting diode (LED) material within a chamber of an LED assembly;
   providing a getter within the chamber of the LED assembly, wherein the getter comprises a thin film applied to a reflective surface in the chamber and is selected to have an affinity for oxygen; and
   controlling an atmosphere within the chamber of the LED assembly at least partially through the use of the getter, wherein the atmosphere is controlled to have less than about 100 ppm oxygen.

2. The method of claim 1 further comprising activating the getter, whereby oxygen is removed from the atmosphere within the LED assembly.

3. The method of claim 1 wherein the providing a getter includes encapsulating the getter in the chamber of the LED assembly.

4. The method of claim 1 further comprising enclosing the LED material within the chamber, wherein the chamber provides a controlled vacuum atmosphere having a pressure of less than about $10^{-3}$ torr.

5. The method of claim 1, wherein the getter does not interfere with the operation of the assembly.

6. the method of claim 1, wherein the getter material comprises ST 787, a Zr—Co-rare earth alloy.

7. A device comprising:
   a reflector cup having an aperture;
   an LED coupled to the reflector cup;
   a getter material deposed at least partially within the aperture of the reflector cup, wherein the getter comprises a thin film applied to a reflective surface in the chamber and is selected to have an affinity for oxygen; and
   a cover for at least partially encapsulating the LED and the getter material in a non-reactive atmosphere, wherein the atmosphere is controlled to have less than about 100 ppm oxygen.

8. The device of claim 7, wherein the getter material does not interfere with the operation of the assembly.

9. The device of claim 7, wherein the getter material comprises ST 787, a Zr—Co-rare earth alloy.

10. The device of claim 7 wherein the non-reactive atmosphere is at a pressure between 100 atmospheres and $10^{-3}$ torr.

11. The device of claim 7 wherein the non-reactive atmosphere includes less than about 100 PPM water.

12. The device of claim 7 wherein the non-reactive atmosphere includes a non-reactive gas selected from the group consisting of inert gasses and noble gasses.

13. The device of claim 7 wherein the controlled atmosphere is a vacuum having a pressure of less than about $10^{-3}$ torr.

14. The device of claim 7 wherein the cover includes a dome.

15. The device of claim 7 wherein the cover includes a cylinder and a lens.

16. The device of claim 7 wherein the cover is translucent.

17. A device comprising:
a reflector having a reflective surface;
an LED coupled to the reflector;
a cover for at least partially encapsulating the LED in a non-reactive atmosphere, wherein the atmosphere is controlled to have less than about 100 ppm oxygen; and
a getter material comprising a thin film applied to the reflective surface in the chamber and selected to have an affinity for oxygen.

18. The device of claim 17, wherein the getter material does not interfere with the operation of the assembly.

19. The white-light-emitting diode assembly of claim 17, wherein the getter material comprises ST 787, a Zr—Co-rare earth alloy.

20. A stabilized, white-light-emitting diode assembly comprising:
a white-light-emitting diode;
a getter material comprising a thin film applied to a reflective surface in the chamber and selected to have an affinity for oxygen; and
a chamber having a controlled atmosphere and containing the white-light-emitting diode and the getter material, wherein the atmosphere is controlled to have less than about 100 ppm oxygen;
and wherein, the white-light-emitting diode is free of any polymeric resin encapsulant.

21. The white-light-emitting diode assembly of claim 20, wherein the light-emitting-diode comprises multilayers of luminescent materials in the InAlGaN family.

22. The white-light-emitting diode assembly of claim 20, wherein the controlled atmosphere is a vacuum having a pressure of less than about $10^{-3}$ torr.

23. The white-light-emitting diode assembly of claim 20, wherein the controlled atmosphere contains a non-reactive fluid or gas having a pressure ranging from about $10^{-3}$ torr to about 10 atmospheres.

24. The white-light-emitting diode assembly of claim 20, wherein the getter material comprises a drying material.

25. The white-light-emitting diode assembly of claim 20, wherein the getter is a non-evaporable getter.

26. The white-light-emitting diode assembly of claim 20, wherein the getter does not interfere with the operation of the assembly.

27. The white-light-emitting diode assembly of claim 20, wherein the light-emitting diode is a phosphor-coated, blue-light-emitting diode that emits a spectrum of colors that combine to produce white light.

28. The white-light-emitting diode assembly of claim 20, wherein the getter material comprises ST 787, a Zr—Co-rare earth alloy.

29. A method of manufacturing a light-emitting diode assembly that emits a light having a stable intensity or wavelength, the method comprising
creating a light-emitting diode assembly having (i) a light-emitting diode in a chamber having a controlled atmosphere and (ii) a getter that comprises a thin film applied to a reflective surface in the chamber and is selected to have an affinity for oxygen; wherein the atmosphere is controlled to have less than about 100 ppm oxygen, and wherein the light-emitting diode is free of any encapsulant material that degrades during operation of the assembly and changes the intensity or wavelength of light emitted from the assembly; and
obtaining a light from the assembly having an intensity or wavelength that remains stable during a period of operation relative to the intensity or wavelength of light emitted during the period of operation from another assembly having a light-emitting diode encapsulated in a polymeric resin.

30. The method of claim 29, wherein the controlled atmosphere has less than about 100 ppm water.

31. The method of claim 29, wherein the controlled atmosphere contains a vacuum having a pressure of less than about $10^{-3}$ torr.

32. The method of claim 29, wherein the controlled atmosphere consists essentially of a non-reactive fluid or gas having a pressure ranging from about $10^{-3}$ torr to about 10 atmospheres.

33. The method of claim 29, wherein the getter does not interfere with the operation of the assembly.

34. The method of claim 29, wherein the getter material comprises ST 787, a Zr—Co-rare earth alloy.

35. The method of claim 29, wherein the creating further comprises adding a phosphor to the chamber to receive the light emitted by the light-emitting diode and re-emit the light as a desired visible color of light having an intensity or wavelength that remains stable during a period of operation relative to the intensity or wavelength of light emitted during the period of operation from another assembly having a light-emitting diode encapsulated in the material that degrades during operation of the assembly and changes the intensity or wavelength of light emitted from the assembly.

36. The method of claim 29, wherein the creating further comprises activating the getter material in the chamber for controlling the atmosphere in the chamber.

37. A method comprising:
providing an LED material within a chamber of an LED assembly;
providing a getter comprising a thin film applied to a reflective surface in the chamber and within the chamber of the LED assembly;
controlling an atmosphere within the chamber of the LED assembly at least partially through the use of the getter; and
activating the getter, wherein the activating includes preselecting a getter activation process that is not incidental to the operation of the LED assembly and is used at a desired time to make the getter effective at absorbing contaminants.

38. The method of claim 37, wherein the preselected getter activation process includes heating the getter at about 350° C. for about 10 minutes to about 30 minutes.

39. The method of claim 37, wherein the preselected getter activation process includes directing a laser beam to contact and heat the getter material.

40. The method of claim 37, wherein the providing a getter includes encapsulating the getter in the chamber of the LED assembly.

41. The method of claim 37 further comprising enclosing the LED material within the chamber, wherein the chamber provides a controlled vacuum atmosphere having a pressure of less than about $10^{-3}$ torr.

42. The method of claim 37, wherein the getter does not interfere with the operation of the assembly.

43. The method of claim 37, wherein the getter material comprises ST 787, a Zr—Co-rare earth alloy.

44. A device comprising:
  a reflector;
  an LED coupled to the reflector cup;
  an activated getter material comprising a thin film applied to a reflective surface in the chamber, wherein the getter is activated using a preselected getter activation process that is not incidental to the operation of the LED assembly and is used at a desired time to make the getter effective at absorbing contaminants; and
  a cover for at least partially encapsulating the LED and the getter material in a non-reactive atmosphere.

45. The device of claim 44, wherein the preselected getter activation process includes heating the getter material at about 350° C. for about 10 minutes to about 30 minutes.

46. The device of claim 44, wherein the preselected getter activation process includes directing a laser beam to contact and heat the getter material.

47. The device of claim 44, wherein the getter does not interfere with the operation of the assembly.

48. The device of claim 44, wherein the getter material comprises ST 787, a Zr—Co-rare earth alloy.

49. The device of claim 44, wherein the non-reactive atmosphere is at a pressure between 100 atmospheres and $10^{-3}$ torr.

50. The device of claim 44, wherein the non-reactive atmosphere includes less than about 100 ppm of oxygen or water.

51. The device of claim 44, wherein the non-reactive atmosphere includes a non-reactive gas selected from the group consisting of inert gasses and noble gasses.

52. The device of claim 44 wherein the non-reactive atmosphere is a vacuum having a pressure of less than about $10^{-3}$ torr.

53. The device of claim 44, wherein the aperture has an inverted truncated conical shape.

54. The device of claim 44 wherein the cover includes a dome.

55. The device of claim 44 wherein the cover includes a cylinder and a lens.

56. The device of claim 44 wherein the cover is translucent.

57. A stabilized, white-light-emitting diode assembly comprising:
  a white-light-emitting diode;
  an activated getter material comprising a thin film applied to a reflective surface in the chamber, wherein (i) the getter material is activated using a preselected getter activation process that is not incidental to the operation of the LED assembly and is used at a desired time to make the getter effective at absorbing contaminants; and
  a chamber having a controlled atmosphere and containing the white-light-emitting diode and the getter material;
  wherein, the white-light-emitting diode is free of any polymeric resin encapsulant and emits a light having an intensity or wavelength that remains stable during operation relative to the intensity or wavelength of light emitted during the period of operation from another assembly having a white-light-emitting diode encapsulated in a such polymeric resin.

58. The assembly of claim 57, wherein the preselected getter activation process includes heating the getter material at about 350° C. for about 10 minutes to about 30 minutes.

59. The assembly of claim 57, wherein the preselected getter activation process includes directing a laser beam to contact and heat the getter material.

60. The assembly of claim 57, wherein the getter does not interfere with the operation of the assembly.

61. The assembly of claim 57, wherein the getter comprises ST 787, a Zr—Co-rare earth alloy.

62. The assembly of claim 57, wherein the light-emitting-diode comprises multilayers of luminescent materials in the InAlGaN family.

63. The assembly of claim 57, wherein the controlled atmosphere is a vacuum having a pressure of less than about $10^{-3}$ torr.

64. The assembly of claim 57, wherein the controlled atmosphere contains a non-reactive fluid or gas having a pressure ranging from about $10^{-3}$ torr to about 10 atmospheres.

65. A stabilized, light-emitting-diode assembly having a desired visible color emission, comprising:
  a light-emitting diode having a primary emission of light that is received by a phosphor and re-emitted as a desired visible color of light;
  an activated getter material comprising a thin film applied to a reflective surface in the chamber and, wherein the getter material is activated using a preselected getter activation process that is not incidental to the operation of the LED assembly and is used at a desired time to make the getter effective at absorbing contaminants; and
  a chamber having a controlled atmosphere and containing the light-emitting diode, the phosphor, and the getter material;
  and wherein,
  the light-emitting diode and the phosphor are each free of any polymeric resin encapsulant, and each respectively emits a light having an intensity or wavelength that remains stable during a period of operation relative to the intensity or wavelength of light emitted during the period of operation from another assembly having a light-emitting diode or phosphor encapsulated in a polymeric resin.

66. The assembly of claim 65, wherein the preselected getter activation process includes heating the getter material at about 350° C. for about 10 minutes to about 30 minutes.

67. The assembly of claim 65, wherein the preselected getter activation process includes directing a laser beam to contact and heat the getter material.

68. The assembly of claim 65, wherein the getter does not interfere with the operation of the assembly.

69. The assembly of claim 65, wherein the getter comprises ST 787, a Zr—Co-rare earth alloy.

70. The assembly of claim 65, wherein the light-emitting diode is a white-light-emitting diode.

71. The assembly of claim 65, wherein the light-emitting diode is a phosphor-coated, blue-light-emitting diode that emits a spectrum of colors that combine to produce white light.

72. The assembly of claim 65, wherein the light-emitting-diode comprises multilayers of luminescent materials in the InAlGaN family.

73. The assembly of claim 65, wherein the controlled atmosphere is a vacuum having a pressure of less than about $10^{-3}$ torr.

74. The assembly of claim 65, wherein the controlled atmosphere contains a non-reactive fluid or gas having a pressure ranging from about $10^{-3}$ torr to about 10 atmospheres.

75. A method of manufacturing a light-emitting diode assembly that emits a light having a stable intensity or wavelength, the method comprising creating a light-emitting diode assembly having a light-emitting diode in a chamber having an activated getter getter comprising a thin film applied to a reflective surface in the chamber, wherein the getter is activated using a preselected getter activation process that is not incidental to the operation of the LED assembly and is used at a desired time to make the getter effective at absorbing contaminants, and wherein the light-emitting diode is free of any encapsulant material that degrades during operation of the assembly and changes the intensity or wavelength of light emitted from the assembly; and obtaining a light from the assembly having an intensity or wavelength that remains stable during a period of operation relative to the intensity or wavelength of light emitted during the period of operation from another assembly having a light-emitting diode encapsulated in a polymeric resin.

76. The method of claim 75, wherein the preselected getter activation process includes heating the getter at about 350° C. for about 10 minutes to about 30 minutes.

77. The method of claim 75, wherein the preselected getter activation process includes directing a laser beam to contact and heat the getter material.

78. The method of claim 75, wherein the creating further comprises adding a phosphor to the chamber to receive the light emitted by the light-emitting diode and re-emit the light as a desired visible color of light having an intensity or wavelength that remains stable during a period of operation relative to the intensity or wavelength of light emitted during the period of operation from another assembly having a light-emitting diode encapsulated in the material that degrades during operation of the assembly and changes the intensity or wavelength of light emitted from the assembly.

79. A method comprising:

providing an LED material within a chamber of an LED assembly;

introducing a metal alloy getter material within the chamber of the LED assembly, wherein the getter is not activated incidentally through operation of the LED assembly, comprises a thin film applied to a reflective surface in the chamber, and does not interfere with the operation of the assembly; and controlling an atmosphere within the chamber of the LED assembly at least partially through the use of the getter.

80. The method of claim 79, wherein the getter is activated using a preselected getter activation process.

81. The method of claim 80, wherein the preselected getter activation process includes heating the getter at about 350° C. for about 10 minutes to about 30 minutes.

82. The method of claim 80, wherein the preselected getter activation process includes directing a laser beam to contact and heat the getter material.

83. The method of claim 79, wherein the introducing includes encapsulating the getter in the chamber of the LED assembly.

84. The method of claim 79, wherein the getter does not interfere with the operation of the assembly.

85. The method of claim 79, wherein the getter material comprises ST 787, a Zr—Co-rare earth alloy.

86. The method of claim 79 further comprising forming the getter on an inner surface of a cylinder, wherein the cylinder at least partially defines the chamber of the LED assembly.

87. The method of claim 79 further comprising enclosing the LED material within the chamber, wherein the chamber provides a controlled vacuum atmosphere having a pressure of less than about $10^{-3}$ torr.

88. A device comprising:
a reflector;
an LED coupled to the reflector;
a metal alloy getter material comprising a thin film applied to a reflective surface in the chamber, wherein the getter is not activated incidentally through operation of the LED assembly; and
a cover for at least partially encapsulating the LED and the getter material in a non-reactive atmosphere.

89. The device of claim 88, wherein the getter is activated using a preselected getter activation process.

90. The device of claim 89, wherein the preselected getter activation process includes heating the getter at about 350° C. for about 10 minutes to about 30 minutes.

91. The device of claim 89, wherein the preselected getter activation process includes directing a laser beam to contact and heat the getter material.

92. The device of claim 88, wherein the getter does not interfere with the operation of the assembly.

93. The device of claim 88, wherein the getter comprises ST 787, a Zr—CO-rare earth alloy.

94. The device of claim 88, wherein the non-reactive atmosphere is at a pressure between 100 atmospheres and $10^{-3}$ torr.

95. The device of claim 88, wherein the non-reactive atmosphere includes less than about 100 ppm of oxygen or water.

96. The device of claim 88, wherein the non-reactive atmosphere includes a non-reactive gas selected from the group consisting of inert gasses and noble gasses.

97. The device of claim 88, wherein the non-reactive atmosphere is a vacuum having a pressure of less than about $10^{-3}$ torr.

98. The device of claim 88, wherein the aperture has an inverted truncated conical shape.

99. The device of claim 88, wherein the cover includes a dome.

100. The device of claim 88, wherein the cover includes a cylinder and a lens.

101. The device of claim 88, wherein the cover is translucent.

102. A device comprising:
a reflector cup having an aperture;
an LED coupled to the reflector cup;
a cover for at least partially encapsulating the LED in a non-reactive atmosphere; and
a metal alloy getter material comprising a thin film a lied to a reflective surface in the chamber and deposed at least partially on the cover, wherein (i) the getter material is activated using a preselected getter activation process that is not incidental to the operation of the LED assembly and is used at a desired time to make the getter effective at absorbing contaminants; and (ii) the getter material does not interfere with the operation of the LED assembly.

103. The device of claim 102, wherein the preselected getter activation process includes heating the getter at about 350° C. for about 10 minutes to about 30 minutes.

104. The device of claim 102, wherein the preselected getter activation process includes directing a laser beam to contact and heat the getter material.

105. The device of claim 102 wherein the cover includes a cylinder and a lens, and wherein the lens is substantially free of the getter material.

106. The assembly of claim 102, wherein the getter does not interfere with the operation of the assembly.

107. The device of claim 102, wherein the getter material comprises ST 787, a Zr—Co-rare earth alloy.

108. A stabilized, white-light-emitting diode assembly comprising:
- a white-light-emitting diode;
- a metal alloy getter material comprising a thin film applied to a reflective surface in the chamber, wherein the getter material is activated using a preselected getter activation process that is not incidental to the operation of the LED assembly and is used at a desired time to make the getter effective at absorbing contaminants; and
- a chamber having a controlled atmosphere and containing the white-light-emitting diode and the getter material;
- wherein, the white-light-emitting diode is free of any polymeric resin encapsulant and emits a light having an intensity or wavelength that remains stable during operation relative to the intensity or wavelength of light emitted during the period of operation from another assembly having a white-light-emitting diode encapsulated in a such polymeric resin.

109. The assembly of claim 108, wherein the preselected getter activation process includes heating the getter at about 350° C. for about 10 minutes to about 30 minutes.

110. The assembly of claim 108, wherein the preselected getter activation process includes directing a laser beam to contact and heat the getter material.

111. The assembly of claim 108, wherein the getter does not interfere with the operation of the assembly.

112. The assembly of claim 108, wherein the getter material comprises ST 787, a Zr—Co-rare earth alloy.

113. The assembly of claim 108, wherein the light-emitting-diode comprises multilayers of luminescent materials in the InAlGaN family.

114. The assembly of claim 108, wherein the controlled atmosphere is a vacuum having a pressure of less than about $10^{-3}$ torr.

115. The assembly of claim 108, wherein the controlled atmosphere contains a non-reactive fluid or gas having a pressure ranging from about $10^{-3}$ torr to about 10 atmospheres.

116. A stabilized, light-emitting-diode assembly having a desired visible color emission, comprising:
- a light-emitting diode having a primary emission of light that is received by a phosphor and re-emitted as a desired visible color of light;
- a metal alloy getter material comprising a thin film applied to a reflective surface in the chamber, wherein the getter material is activated using a preselected getter activation process that is not incidental to the operation of the LED assembly and is used at a desired time to make the getter effective at absorbing contaminants; and
- a chamber having a controlled atmosphere and containing the light-emitting diode, the phosphor, and the getter material;
- and wherein,
- the light-emitting diode and the phosphor are each free of any polymeric resin encapsulant, and each respectively emits a light having an intensity or wavelength that remains stable during a period of operation relative to the intensity or wavelength of light emitted during the period of operation from another assembly having a light-emitting diode or phosphor encapsulated in a polymeric resin.

117. The assembly of claim 116, wherein the preselected getter activation process includes heating the getter at about 350° C. for about 10 minutes to about 30 minutes.

118. The assembly of claim 116, wherein the preselected getter activation process includes directing a laser beam to contact and heat the getter material.

119. The assembly of claim 116, wherein the getter does not interfere with the operation of the assembly.

120. The assembly of claim 116, wherein the getter material comprises ST 787, a Zr—Co-rare earth alloy.

121. The assembly of claim 116, wherein the light-emitting diode is a white-light-emitting diode.

122. The assembly of claim 116, wherein the light-emitting diode is a phosphor-coated, blue-light-emitting diode that emits a spectrum of colors that combine to produce white light.

123. The assembly of claim 116, wherein the light-emitting-diode comprises multilayers of luminescent materials in the InAlGaN family.

124. The assembly of claim 116, wherein the controlled atmosphere is a vacuum having a pressure of less than about $10^{-3}$ torr.

125. The assembly of claim 116, wherein the controlled atmosphere contains a non-reactive fluid or gas having a pressure ranging from about $10^{-3}$ torr to about 10 atmospheres.

126. A method comprising:
- providing a light-emitting diode (LED) material within a chamber of an LED assembly;
- introducing a getter within the chamber of the LED assembly, wherein the getter comprises a thin film applied to a reflective surface in the chamber and does not interfere with the operation of the LED assembly.

127. The method of claim 126, wherein the method further comprises providing a phosphor in the chamber, wherein the phosphor absorbs light from the LED material and causes the LED assembly to emit light of a desired wavelength.

128. The method of claim 127, wherein the providing a phosphor includes depositing the phosphor on the LED material.

129. The method of claim 127, wherein the LED assembly emits white light.

130. The method of claim 126, wherein the introducing includes depositing the getter using a process comprising sputtering the getter onto the reflective surface.

131. The method of claim 126, wherein the introducing includes depositing the getter using a process comprising evaporating the getter onto the reflective surface.

132. The method of claim 126, wherein the LED assembly includes a reflector cup comprising the reflective surface.

133. The method of claim 126, wherein the getter is selected to have an affinity for oxygen.

134. The method of claim 126, wherein the getter comprises ST787, a Zr—Co-rare earth alloy.

135. A light-emitting device comprising:
- a light-emitting diode (LED) material positioned within a chamber of an LED assembly;
- a getter positioned within the chamber of the LED assembly, wherein the getter comprises a thin film applied to a reflective surface in the chamber and does not interfere with the operation of the LED assembly.

136. The light-emitting device of claim 135 further comprising a phosphor positioned in the chamber, wherein the phosphor absorbs light from the LED material and causes the LED assembly to emit light of a desired wavelength.

137. The light-emitting device of claim 135, wherein the phosphor is deposited on the LED material.

138. The light-emitting device of claim 135, wherein the LED assembly emits white light.

139. The light-emitting device of claim 135, wherein the getter is composed of a thin film produced using a process comprising sputtering the getter onto the reflective surface.

140. The light-emitting device of claim 135, wherein the getter is composed of a thin film produced using a process comprising, wherein the getter is composed of a thin film produced using a process comprising evaporating the getter onto the reflective surface.

141. The light-emitting device of claim 135, wherein the LED assembly includes a reflector cup comprising the reflective surface.

142. The light-emitting device of claim 135, wherein the getter is selected to have an affinity for oxygen.

143. The light-emitting device of claim 135, wherein the getter comprises ST787, a Zr—Co-rare earth alloy.

144. The light-emitting device of claim 135, wherein the chamber has a controlled atmosphere comprising less than about 100 ppm oxygen.

145. A white-light-emitting device comprising:
   a light-emitting diode (LED) material positioned within a chamber of an LED assembly;
   a phosphor positioned in the chamber, wherein the phosphor absorbs light from the LED material and causes the LED assembly to emit a white light; and,
   a getter positioned within the chamber of the LED assembly, wherein the getter comprises a thin film applied to a reflective surface in the chamber and does not interfere with the operation of the LED assembly.

146. The white-light-emitting device of claim 145, wherein the phosphor is deposited on the LED material.

147. The white-light-emitting device of claim 145, wherein the getter comprises ST787, a Zr—Co-rare earth alloy.

148. The white-light-emitting device of claim 145, wherein the LED assembly includes a reflector cup comprising the reflective surface.

149. The white-light-emitting device of claim 145, wherein the getter is composed of a thin film produced using a process comprising sputtering the getter onto the reflective surface.

150. The white-light-emitting device of claim 145, wherein the getter is composed of a thin film produced using a process comprising, wherein the getter is composed of a thin film produced using a process comprising evaporating the getter onto the reflective surface.

151. The white-light-emitting device of claim 145, wherein the chamber has a controlled atmosphere comprising less than about 100 ppm oxygen.

* * * * *